(12) United States Patent
Schmid et al.

(10) Patent No.: US 8,956,808 B2
(45) Date of Patent: Feb. 17, 2015

(54) ASYMMETRIC TEMPLATES FOR FORMING NON-PERIODIC PATTERNS USING DIRECTED SELF-ASSEMBLY MATERIALS

(71) Applicant: GLOBALFOUNDRIES Inc., Grand Cayman (KY)

(72) Inventors: Gerard M. Schmid, Rensselaer, NY (US); Richad A. Farrell, Albany, NY (US); Ji Xu, Watervliet, NY (US); Jason R. Cantone, Mechanicville, NY (US); Moshe E. Preil, Sunnyvale, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 51 days.

(21) Appl. No.: 13/693,627

(22) Filed: Dec. 4, 2012

(65) Prior Publication Data

US 2014/0154630 A1 Jun. 5, 2014

(51) Int. Cl.
*G03F 7/26* (2006.01)
*G03F 7/20* (2006.01)

(52) U.S. Cl.
CPC .................................. *G03F 7/20* (2013.01)
USPC ......................................................... 430/323

(58) Field of Classification Search
CPC ....... G03F 7/0035; G03F 7/0002; G03F 7/20; G03F 7/26; H01L 21/302
USPC .......................................... 430/322, 323, 330
See application file for complete search history.

(56) References Cited

U.S. PATENT DOCUMENTS

| | | | |
|---|---|---|---|
| 7,964,107 B2 * | 6/2011 | Millward ........................ | 216/17 |
| 7,977,242 B2 | 7/2011 | Sadjadi et al. | |
| 2002/0158342 A1 | 10/2002 | Tuominen et al. | |
| 2006/0165984 A1 | 7/2006 | Miguez et al. | |
| 2007/0099431 A1 | 5/2007 | Li | |
| 2007/0200477 A1 | 8/2007 | Tuominen et al. | |
| 2007/0249744 A1 | 10/2007 | Landskron et al. | |
| 2009/0305437 A1 | 12/2009 | Allemand et al. | |
| 2010/0239983 A1 * | 9/2010 | Sills et al. ..................... | 430/322 |
| 2011/0034029 A1 * | 2/2011 | Matsunaga et al. ........... | 438/689 |
| 2012/0207940 A1 * | 8/2012 | Muramatsu et al. .......... | 427/510 |
| 2013/0045877 A1 | 2/2013 | Yap et al. | |
| 2013/0183827 A1 * | 7/2013 | Millward ....................... | 438/694 |

FOREIGN PATENT DOCUMENTS

WO    WO 2012-084558    *    6/2012

OTHER PUBLICATIONS

Related application U.S. Appl. No. 13/764,051 Office Action dated Jan. 2, 2014.

* cited by examiner

*Primary Examiner* — Brittany Raymond
(74) *Attorney, Agent, or Firm* — Amerson Law Firm, PLLC

(57) ABSTRACT

A method includes forming a template having a plurality of elements above a process layer, wherein portions of the process layer are exposed between adjacent elements of the template. A directed self-assembly layer is formed over the exposed portions. The directed self-assembly layer has alternating etchable components and etch-resistant components. The etchable components of the directed self-assembly layer are removed. The process layer is patterned using the template and the etch-resistant components of the directed self-assembly layer. Non-periodic elements are defined in the process later by the template and periodic elements are defined in the process layer by the etch-resistant components of the directed self-assembly layer.

18 Claims, 3 Drawing Sheets

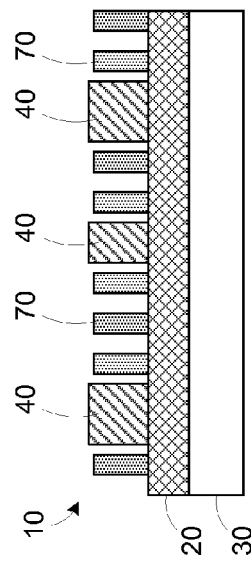
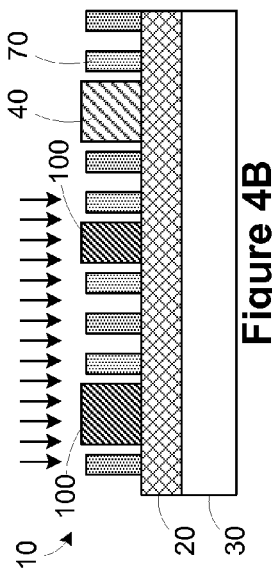
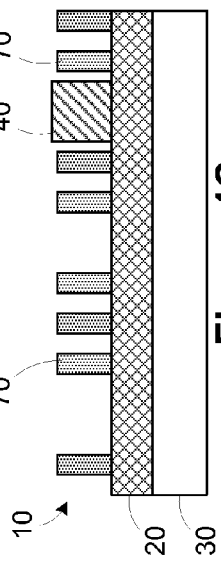
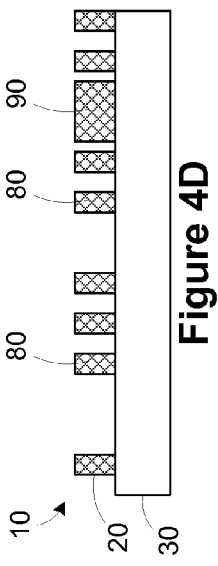
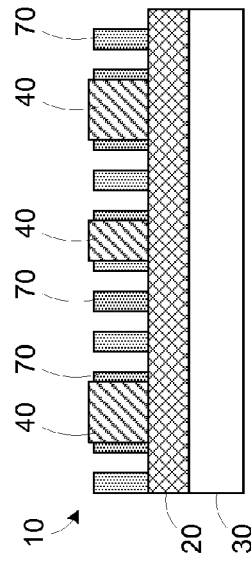
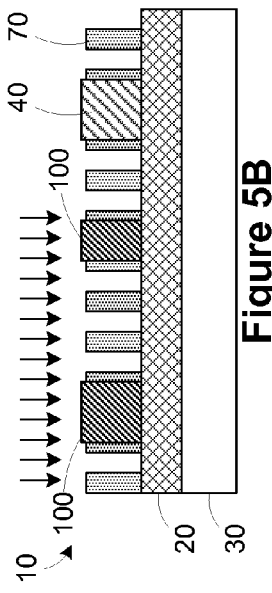
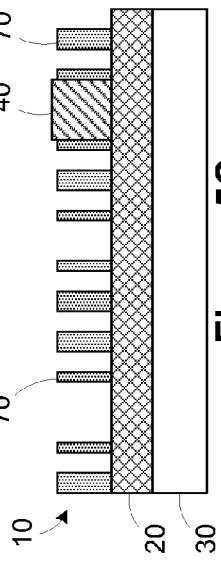
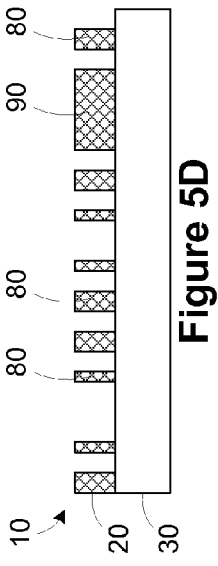

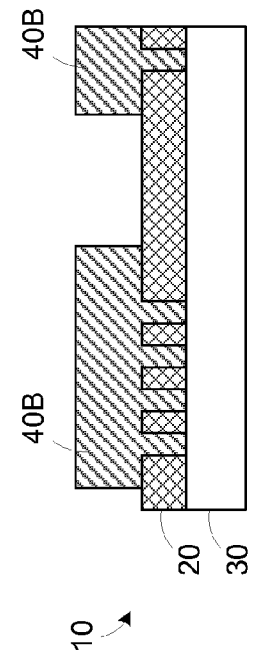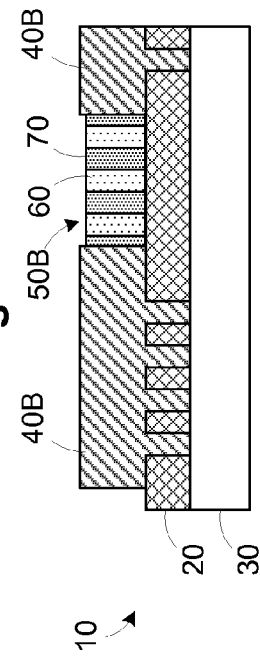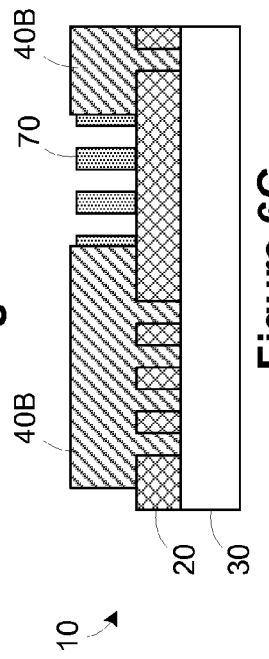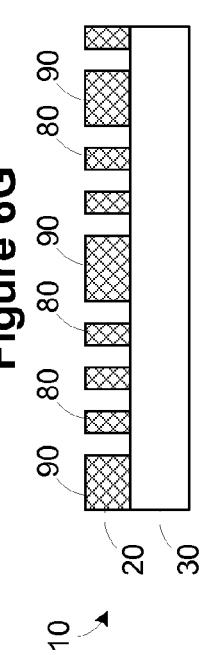

ASYMMETRIC TEMPLATES FOR FORMING NON-PERIODIC PATTERNS USING DIRECTED SELF-ASSEMBLY MATERIALS

BACKGROUND

The disclosed subject matter relates generally to manufacturing and, more particularly, to using asymmetric templates for forming non-periodic patterns using directed self-assembly materials.

Many technological applications require the ability to pattern precise structures with a periodicity (pitch) below 60 nm. Existing optical lithography is capable of high-throughput processing, but the patterning pitch of a single optical lithography step is limited to about 80 nm. A challenge for lithography is to devise tools, materials, and processes that can reliably, efficiently, and quickly pattern structures with smaller dimensions and reduced pitch.

Directed Self-Assembly (DSA) lithography is a materials-based approach that relies on the phase separation of certain polymeric materials. A basic DSA process consists of coating a polymeric material on a substrate over a previously formed guide structure. The guide pattern is typically formed by an optical lithography process. The polymeric self-assembly material contains two (or more) chemical components that have carefully controlled size. These components can be bonded together into polymer chains known as diblocks, such as A-A-A-A-A-A-A-A-A-A-B-B-B-B-B-B-B-B-B-B. Immediately after coating, the A and B components are relatively disordered, however, these components (A, B) can be induced to separate into distinct phases and thereby form features with a characteristic pitch that is defined by the chemical composition. By coating this polymer on a substrate with a pre-formed guide pattern, it is possible to "interpolate" the features between the elements of the guide pattern and reduce the pitch by a factor of 2-40 relative to the guide pattern.

While DSA has shown promise in creating large areas of straight line/space patterns with constant pitch, it is difficult to pattern lines of varying pitch and/or dimensions. Such structures are useful for semiconductor device applications.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF EMBODIMENTS

The following presents a simplified summary of only some aspects of embodiments of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method that includes forming a template having a plurality of elements above a process layer, wherein portions of the process layer are exposed between adjacent elements of the template. A directed self-assembly layer is formed over the exposed portions. The directed self-assembly layer has alternating etchable components and etch-resistant components. The etchable components of the directed self-assembly layer are removed. The process layer is patterned using the template and the etch-resistant components of the directed self-assembly layer. Non-periodic elements are defined in the process later by the template and periodic elements are defined in the process layer by the etch-resistant components of the directed self-assembly layer.

Another aspect of the disclosed subject matter is seen in a method that includes forming a first template having a first plurality of elements above a process layer, wherein portions of the process layer are exposed between adjacent elements of the first template. A first directed self-assembly layer is formed over the exposed portions. The first directed self-assembly layer has alternating etchable components and etch-resistant components. The etchable components of the first directed self-assembly layer are removed. The process layer is patterned using the first template and the etch-resistant components of the first directed self-assembly layer. A first plurality of periodic elements are defined in the process layer by the etch-resistant components of the first directed self-assembly layer. A second template having a second plurality of elements is formed above the process layer, wherein portions of the process layer are exposed between adjacent elements of the second template. A second directed self-assembly layer is formed over the exposed portions. The second directed self-assembly layer has alternating etchable components and etch-resistant components. The etchable components of the second directed self-assembly layer are removed. The process layer is patterned using the second template and the etch-resistant components of the second directed self-assembly layer. A second plurality of periodic elements are defined in the process layer by the etch-resistant components of the second directed self-assembly layer and non-periodic elements are defined in the process later in regions covered by both the first and second templates during the patterning of the process layer.

BRIEF DESCRIPTION OF THE SEVERAL VIEWS OF THE DRAWINGS

The disclosed subject matter will hereafter be described with reference to the accompanying drawings, wherein like reference numerals denote like elements, and:

FIGS. 4A-4D are cross-section diagrams illustrating the patterning of the process layer using a DSA layer with an etchable component wetting the template of FIG. 1, where a portion of the template is removed prior to the patterning of the process layer;

FIGS. 5A-5D are cross-section diagrams illustrating the patterning of the process layer using a DSA layer with an etch-resistant component wetting the template of FIG. 1, where a portion of the template is removed prior to the patterning of the process layer; and FIGS. 6A-6H are cross-section diagrams illustrating the patterning of the process layer using a double patterning process with multiple templates and multiple DSA layers.

Figure 1:
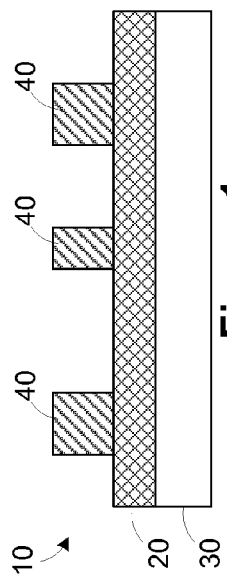
FIG. 1 is a cross-section diagram of a semiconductor device including a process layer and a template.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIGS. 1 through 4B, the disclosed subject matter shall be described in the context of an illustrative semiconductor device 10 in an intermediate stage of manufacture. The device 10 includes a process layer 20 formed above a substrate 30. The substrate 30 may be a bulk substrate or a semiconductor on insulator substrate. The process layer 20 represents one or more layers to be patterned, and may include one or more layers that have desirable interactions with the DSA materials. For example, the process layer 20 might include a layer that is substantially neutral toward the DSA material and/or a layer that induces the DSA material to orient with phase boundaries that are perpendicular to the substrate. The process layer 20 might also include layers that are chosen for having antireflective properties to improve photolithographic patterning. The process layer 20 might also include intermediate etch transfer layers to facilitate etch transfer of the DSA pattern into underlying layers. The process layer 20 may also include a hard mask layer that is used to pattern another underlying layer formed on the substrate 30.

In FIG. 1, a template 40 is formed above the process layer 20. In the illustrated embodiment, the template is formed using a photoresist material and patterned to expose the process layer 20 as illustrated. The process layer 20 may include a bottom anti-reflective coating (BARC) to facilitate the photolithography patterning process to form the template 40. Exemplary processes for forming the template 40 include argon fluoride (ArF) immersion lithography, ArF dry lithography, KrF lithography, UV lithography, extreme ultraviolet (EUV) lithography, electron beam lithography, and imprint lithography. The template 40 may also be modified using resist trim dry etch or chemical shrink processes known in the art to reduce the width of the elements of the template 40 after they are formed by lithography. The elements of the template 40 may have different sizes to facilitate patterning of non-periodic features in the process layer 20.

In the Figures that follow, the template 40 is used in conjunction with a directed self-assembly (DSA) material to pattern features in the process layer 20 using graphoepitaxy patterning process. Exemplary DSA materials include di-block copolymers, tri-block copolymers, ring copolymers, star copolymers, blends of homopolymers, blends of copolymers, and combinations thereof. The DSA material includes two (or more) chemical components that have controlled sizes. These components are bonded together into polymer chains known as diblocks, such as A-A-A-A-A-A-A-A-A-B-B-B-B-B-B-B-B-B-B. The self-assembly material is typically applied using a spin-coating process. Immediately after coating, the A and B (and C, D, etc.) components are relatively disordered. The A and B components are induced to separate into distinct phases and thereby form features with a characteristic pitch that is defined by the chemical composition. The DSA process is driven by thermodynamic instability. This phase separation can be promoted by any of several annealing processes, such as thermal annealing (baking), solvent annealing, or combinations thereof. The DSA material "interpolates" the features between the guide patterns and can reduce the pitch by a factor of 2-40 relative to the template 40. For DSA materials, the width of the space between features in the template 40 is constrained to be approximately an integer multiple of the natural period of the DSA material to avoid introducing defects within the DSA material. The DSA material has intrinsic phase morphology and periodicity/pitch. These properties are determined by the chemical composition of the material and can be fine-tuned by changing the chemical composition. Processes for forming the DSA materials and processing the deposited material to form the ordered pattern are known to those of ordinary skill in the art, so they are not described in greater detail herein.

Figure 2A:
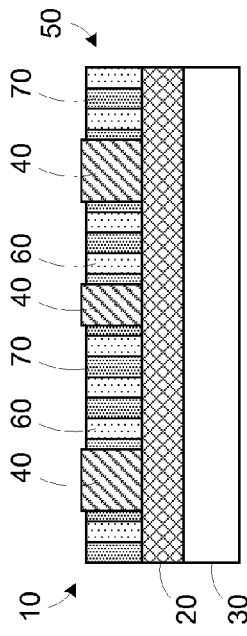
FIGS. 2A-2C are cross-section diagrams illustrating the patterning of the process layer using a directed self-assembly (DSA) layer with an etchable component wetting the template of FIG. 1.
Figure 2B:
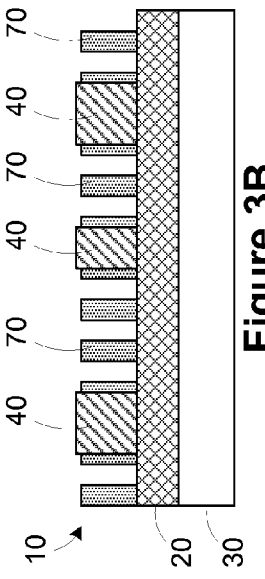
Figure 2C:
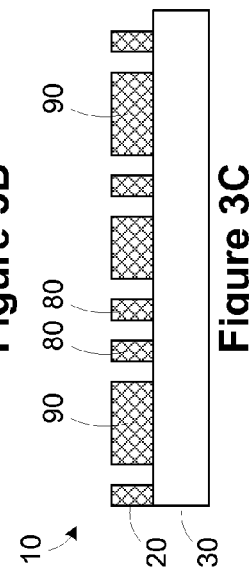
Figure 3A:
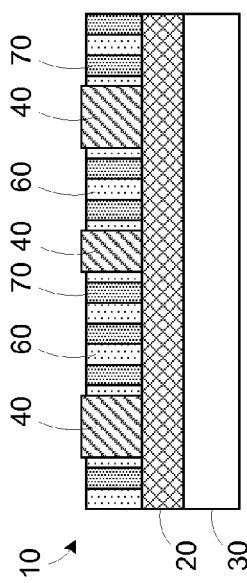
FIGS. 3A-3C are cross-section diagrams illustrating the patterning of the process layer using a DSA layer with an etch-resistant component wetting the template of FIG. 1.
Figure 3B:
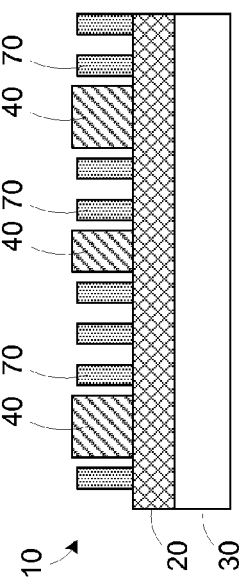
Figure 3C:
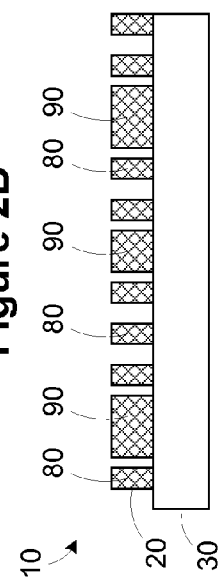

In general, the DSA material includes an etchable component and an etch-resistant component. Depending on the particular DSA material selected, either the etchable material or the etch-resistant material wets the sidewalls of the template 40. Further, the template 40 can be treated to adjust the wetting properties with respect to the DSA materials. For example, the template 40 can be treated by exposure to UV radiation, an aqueous base, or a surfactant solution. The template 40 can also be treated by grafting of polymeric, oligomeric, or other components to adjust the wetting properties with respect to the DSA materials. The surface of the template 40 can also be treated by deposition of material by plasma deposition, chemical vapor deposition, atomic layer deposition, or combinations thereof to adjust the wetting properties. FIGS. 2A-2C illustrate the case where the etchable material wets the template 40, and FIGS. 3A-3C illustrate the case where the etch-resistant component wets the template 40. It should be noted that the template 40 can comprise a resist material or a material that is patterned from a resist material. Further, the template 40 can be treated by known methods to adjust the wetting properties with respect to the DSA materials. The particular choice of material and processing depends on the construct of the features to be patterned in the underlying process layer 20.

In FIGS. 2A and 3A, a DSA layer 50 is formed above the process layer 20 and its structure is controlled by its inherent properties and the template 40. The DSA layer 50 includes an etchable component 60 and an etch-resistant component 70.

In FIGS. 2B and 3B, the etchable component 60 of the DSA layer 50 is removed formed above the process layer 20. For a DSA material of polystyrene (PS) and polymethylmethacrylate (PMMA), the PMMA component can be selectively removed by dry/plasma etching using oxygen and/or argon and/or fluorocarbon gas chemistry, for example. The PMMA component can also be removed in a two-step process, starting with a UV exposure of the copolymer, which substantially degrades the PMMA block and/or cross-links the PS block, followed by wet dissolution of the PMMA in a selective solvent such as acetic acid, for example. These etch procedures may be generalized to work for other copolymers that include at least 1 acrylate block and 1 non-acrylate block. For a copolymer of polystyrene (PS) and polydimethylsiloxane (PDMS), the PS block can be selectively removed by dry/plasma etching using oxygen and/or argon gas chemistry, for example. This etch procedure can also be generalized to work for other copolymers that include at least one element which confers added etch resistance, such as Si, Zr, Hf, etc.

The etch template formed by the template 40 and the etch-resistant portions 70 of the DSA layer 50 is used to etch the process layer 20 as illustrated in FIGS. 2C and 3C. The particular etch process used depends on the material of the process layer 20. Those of ordinary skill in the art are familiar with etch processes to etch various semiconductor materials, metals, or dielectric materials that may be present in the process layer 20. The etched process layer 20 includes periodic components 80 defined by the remaining portions 70 of the DSA layer 50 and non-periodic components defined by the template 40. The pitch of the periodic components 80 is characterized by the intrinsic pitch of the DSA layer 50, while the non-periodic components 90 are formed based on the dimensions and spacing of the template 40. Note that the non-periodic components 90 may have different sizes.

FIGS. 4 and 5 illustrate a process for modifying the template prior to the etching of the process layer 20. FIGS. 4A and 5A show the template 40 and the DSA layer 50 after removal of the etchable component 60. In FIGS. 4B and 5B, a selective UV exposure and baking process is performed to treat portions 100 of the template 40 that are to be removed. The UV exposure modulates the solubility of the photoresist in a developer solvent/solution. The selective treatment process may be conducted using a masking technique or a directed exposure technique. In FIGS. 4C and 5C, the treated portions of the template 40 are removed using a strip process.

The etch template formed by the remaining portions of the template 40 and the etch-resistant portions 70 of the DSA layer 50 is used to etch the process layer 20 as illustrated in FIGS. 4D and 5D. The etched process layer 50 includes periodic components 80 defined by the remaining portions 70 of the DSA layer 50 and non-periodic components 90 defined by the remaining portions of the template 40. The selective removal of portions of the template 40 allows the tailoring of the pattern etched into the process layer 20. Removal of the topographic guide patterns might be useful, for example, if the desired non-periodic element is a trench vs. a line feature.

FIGS. 6A-6H illustrate a technique where a double patterning process is used to generate non-periodic components 90 in the process layer 20. In FIG. 6A, a first template 40A is formed above the process layer 20. In FIG. 6B, a first DSA layer 50A is formed including an etchable component 60 and an etch-resistant component 70. The particular component 60, 70 of the DSA layer 50A that wets the template 40A may vary, as described above. The etchable component 60 is removed in FIG. 6C, and the process layer 20 is patterned using the template 40A and the remaining portions 70 of the DSA layer 50A, as illustrated in FIG. 6D.

In FIG. 6E, a second template 40B is formed above the process layer 20. In FIG. 6F, a second DSA layer 50B is formed. Again, the particular component 60, 70 of the DSA layer 50A that wets the template 40A may vary, including varying in wetting component 60, 70 as compared to the DSA layer 50A. In FIG. 6G, the etchable component 60 is removed. In FIG. 6H, the process layer 20 is patterned again using the template 40B and the remaining portions 70 of the DSA layer 50B. The pattern formed in the process layer 20 included periodic elements 80 defined by remaining portions 70 of the first and second DSA layers 50A, 50B and non-periodic components 90 defined by the interfacing of the templates 40A, 40B at the edges of the periodic pattern boundaries. It should be noted that resist patterns 40A and 40B might comprise two different resist materials with different patterning dimensions. Likewise, the self-assembly layers 50A and 50B might consist of different materials with different patterning dimensions.

This approach is effective in forming smaller and better controlled non-periodic elements 90 because the size of the non-periodic element 90 is decoupled from the resolution of the template 40A, 40B resist features. Instead, the size of the non-periodic elements 90 are determined by the overlay of the two patterning steps. Exemplary lithography processes for performing the techniques illustrated in FIGS. 6A-6H are ArF lithography, KrF lithography, UV lithography, EUV lithography, and imprint lithography.

Patterning the process layer 20 using the techniques described herein allows periodic patterns to be formed using the DSA layer 50, 50A, 50B and non-periodic patterns to be formed using the template 40, 40A, 40B. Such non-periodic elements 90 may be used for functional parts of electrical devices, alignment, and/or registration patterns. For a DSA process, the width of the space between features is constrained to be (approximately) an integer multiple of the natural period of the DSA material or defects will occur within the DSA material. Using the techniques described herein, non-periodic elements can be created by tuning the width of the features in the template 40, 40A, 40B in conjunction with the integration process to meet the requirements of the device design. The size of the non-periodic elements 90 is determined by the final width of the template features and the proximity of the etched or unetched phase of the DSA material.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
   forming a template having a plurality of elements above a process layer, wherein first portions of the process layer are exposed between adjacent elements of the template;
   forming a directed self-assembly layer over the first exposed portions, the directed self-assembly layer having alternating etchable components and etch-resistant components;
   removing the etchable components of the directed self-assembly layer to expose second portions of the process layer;
   selectively removing at least one element of the template after forming the directed self-assembly layer to expose at least a third portion of the process layer; and
   etching the process layer after selectively removing the at least one element using the template and the etch-resistant components of the directed self-assembly layer as an etch mask to etch the second exposed portion of the process layer and the entire third exposed portion of the process layer, wherein non-periodic elements are defined in the process layer by the template and periodic elements are defined in the process layer by the etch-resistant components of the directed self-assembly layer, wherein forming the template comprises forming a first portion of the template, forming the directed self-assembly layer comprises forming a first portion of the directed self-assembly layer over a first portion of the first exposed portions, removing the etchable components comprises removing the etchable components of the first portion of the directed self-assembly layer, patterning the process layer comprises patterning the process layer using the first portion of the template and the etch-resistant components of the first portion of the directed self-assembly layer, and the method further comprises:
   forming a second portion of the template having a plurality of elements above the process layer, wherein fourth portions of the process layer are exposed between adjacent elements of the second portion of the template;
   forming a second portion of the directed self-assembly layer over the fourth exposed portions between adjacent elements of the second portion of the template;
   removing the etchable components of the second portion of the directed self-assembly layer; and
   patterning the process layer using the second portion of the template and the etch-resistant components of the second portion of the directed self-assembly layer, wherein non-periodic elements are defined in the process layer by overlapping portions of the first and second portion of the template and periodic elements are defined in the process layer by the etch-resistant components of the first and second portions of the directed self-assembly layer.

2. The method of claim 1, wherein selectively removing the at least one element of the template further comprises:
   exposing the at least one element to a radiation source; and
   removing the at least one element.

3. The method of claim 1, wherein forming the template further comprises:
   forming a photoresist layer over the process layer; and
   patterning the photoresist layer to define the template.

4. The method of claim 3, further comprising performing a resist trim etch on the template.

5. The method of claim 3, further comprising performing a chemical shrink on the template.

6. The method of claim 3, further comprising performing a surface treatment of the template to affect whether the etchable components or the etch resistant components wet the template.

7. The method of claim 1, wherein portions of the directed self-assembly layer adjacent the elements of the template comprise etchable components.

8. The method of claim 1, wherein portions of the directed self-assembly layer adjacent the elements of the template comprise etch-resistant components.

9. The method of claim 1, wherein forming the template, forming the directed self-assembly layer, removing the etchable components, and patterning the process layer comprises repeating the processes of forming the template, forming the directed self-assembly layer, removing the etchable components, and patterning the process layer in multiple stages, wherein non-periodic elements are defined in the process layer by overlapping portions of the templates formed during the multiple stages and periodic elements are defined in the process layer by the etch-resistant components of the multiple stages of the directed self-assembly layer.

10. The method of claim 1, wherein at least two of the elements of the template have different sizes.

11. The method of 1, wherein a material of the directed self-assembly layer comprises at least one of a di-block copolymer, a tri-block copolymer, a ring copolymer, a star copolymer, a blend of homopolymers, a blend of copolymers, or a combination thereof.

12. A method, comprising:
   forming a first template having a first plurality of elements above a process layer, wherein portions of the process layer are exposed between adjacent elements of the first template;
   forming a first directed self-assembly layer over the exposed portions, the first directed self-assembly layer having alternating etchable components and etch-resistant components;
   removing the etchable components of the first directed self-assembly layer;
   patterning the process layer using the first template and the etch-resistant components of the first directed self-assembly layer, wherein a first plurality of periodic elements are defined in the process layer by the etch-resistant components of the first directed self-assembly layer;
   forming a second template having a second plurality of elements above the process layer, wherein portions of the process layer are exposed between adjacent elements of the second template;
   forming a second directed self-assembly layer over the exposed portions, the second directed self-assembly layer having alternating etchable components and etch-resistant components;
   removing the etchable components of the second directed self-assembly layer; and patterning the process layer using the second template and the etch-resistant components of the second directed self-assembly layer, wherein a second plurality of periodic elements are defined in the process layer by the etch-resistant components of the second directed self-assembly layer and non-periodic elements are defined in the process layer in regions covered by both the first and second templates during the patterning of the process layer.

13. The method of claim 12, wherein the first and second templates comprise photoresist.

14. The method of claim 12, wherein portions of the first directed self-assembly layer adjacent the elements of the first template comprise etchable components.

15. The method of claim 14, wherein portions of the second directed self-assembly layer adjacent the elements of the second template comprise etchable components.

16. The method of claim 14, wherein portions of the second directed self-assembly layer adjacent the elements of the second template comprise etch-resistant components.

17. The method of claim 14, wherein portions of the first directed self-assembly layer adjacent the elements of the first template comprise etch-resistant components.

18. The method of 12, wherein a material of the directed self-assembly layer comprises at least one of a di-block copolymer, a tri-block copolymer, a ring copolymer, a star copolymer, a blend of homopolymers, a blend of copolymers, or a combination thereof.

* * * * *

UNITED STATES PATENT AND TRADEMARK OFFICE
CERTIFICATE OF CORRECTION

| | | |
|---|---|---|
| PATENT NO. | : 8,956,808 B2 | Page 1 of 1 |
| APPLICATION NO. | : 13/693627 | |
| DATED | : February 17, 2015 | |
| INVENTOR(S) | : Schmid et al. | |

It is certified that error appears in the above-identified patent and that said Letters Patent is hereby corrected as shown below:

In the Claims

In claim 1, at column 7, line 64, delete "portion" and insert therefor -- portions --.

In claim 17, at column 9, line 21, delete "claim 14" and insert therefor -- claim 12 --.

Signed and Sealed this
Second Day of June, 2015

Michelle K. Lee
*Director of the United States Patent and Trademark Office*